US006110331A

United States Patent [19]
Rolfson

[11] Patent Number: 6,110,331
[45] Date of Patent: Aug. 29, 2000

[54] APPARATUS AND SYSTEM FOR FABRICATING LITHOGRAPHIC STENCIL MASKS

[75] Inventor: J. Brett Rolfson, Boise, Id.

[73] Assignee: Micron Technology, Inc., Boise, Id.

[21] Appl. No.: 09/255,468

[22] Filed: Feb. 22, 1999

Related U.S. Application Data

[62] Division of application No. 08/961,350, Oct. 30, 1997, Pat. No. 5,968,336.

[51] Int. Cl.$^7$ ................................................ C25D 17/00
[52] U.S. Cl. .................................. 204/224 M; 134/94.1; 134/99.1; 134/182
[58] Field of Search ...................... 204/224 M; 134/94.1, 134/99.1, 182, 901

[56] References Cited

U.S. PATENT DOCUMENTS

| | | | |
|---|---|---|---|
| 5,110,373 | 5/1992 | Mauger | 148/33.2 |
| 5,401,932 | 3/1995 | Hashimoto et al. | 219/69.17 |
| 5,567,551 | 10/1996 | Yahalom et al. | 430/5 |

OTHER PUBLICATIONS

Behringer, U. and Engelke, H., "Intelligent design splitting in the stencil mask technology used for electron–and ion––beam lithography", J. Vac. Sci. Technol. B 11(6), Nov./Dec. 1993, pp. 2400–2403.

*Primary Examiner*—Kathryn Gorgos
*Assistant Examiner*—Thomas H Parsons
*Attorney, Agent, or Firm*—Stephen A.. Gratton

[57] ABSTRACT

A method, apparatus and system for fabricating a stencil mask for ion beam and electron beam lithography are provided. The stencil mask includes a silicon substrate, a membrane formed from the substrate, and a mask pattern formed by through openings in the membrane. The method includes defining the mask pattern and membrane area using semiconductor fabrication processes, and then forming the membrane by back side etching the substrate. The apparatus is configured to electrochemically wet etch the substrate, and to equalize pressure on either side of the substrate during the etch process. The system includes an ion implanter for defining a membrane area on the substrate, optical or e-beam pattern generators for patterning various masks on the substrate, a reactive ion etcher for etching the mask pattern in the substrate, and the apparatus for etching the back side of the substrate.

11 Claims, 3 Drawing Sheets

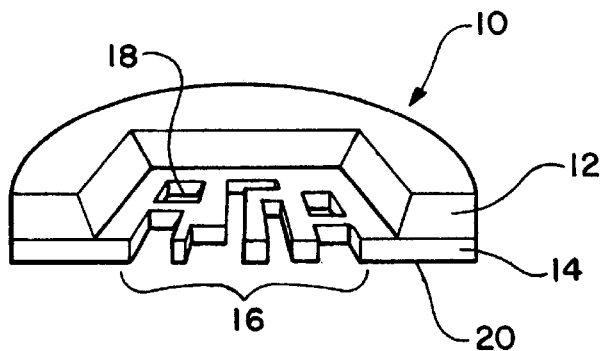

FIGURE 1
(PRIOR ART)

| PROVIDING A SILICON SUBSTRATE. |
|---|
| DEFINING A MEMBRANE AREA ON A FIRST SIDE OF THE SUBSTRATE BY IMPLANTING A DOPANT TO A SELECTED DEPTH. |
| DEFINING A MASK PATTERN BY PATTERNING AND ETCHING RECESSES IN THE MEMBRANE AREA. |
| ELECTROCHEMICALLY ETCHING THE SUBSTRATE FROM A SECOND OPPOSING SIDE OF THE SUBSTRATE TO FORM THE MEMBRANE, OPEN THE RECESSES AND COMPLETE THE MASK PATTERN. |

FIGURE 2

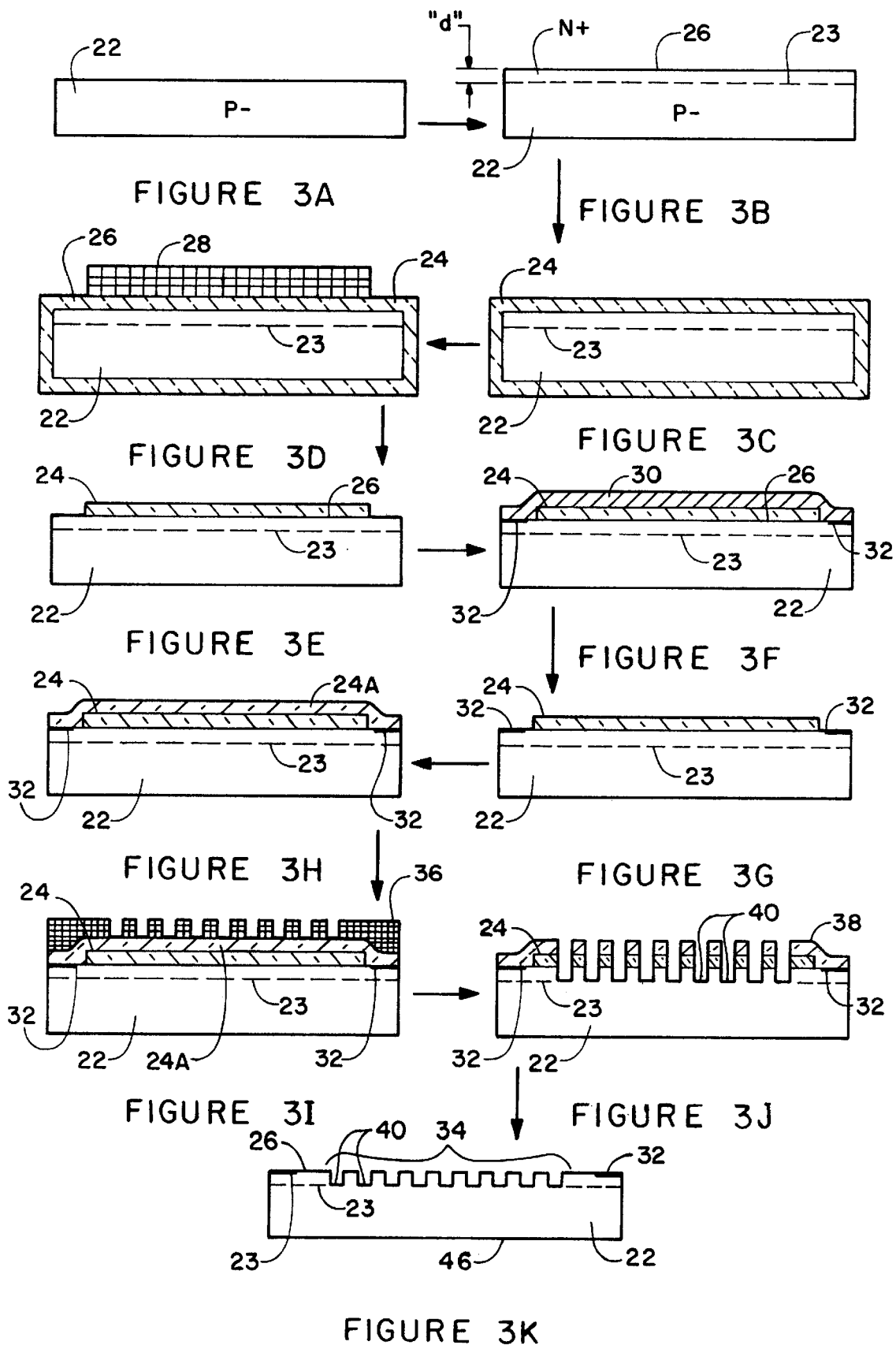

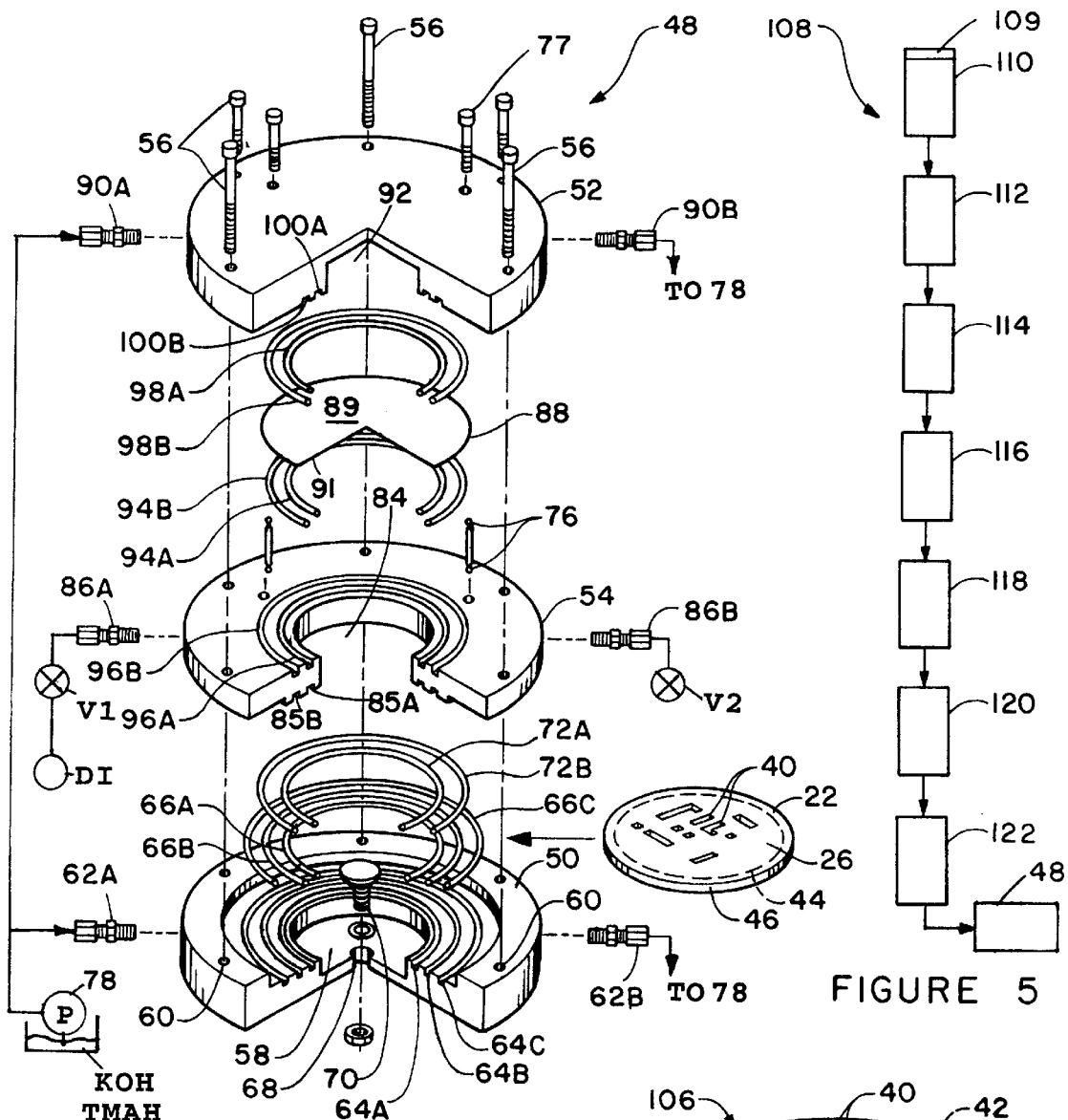
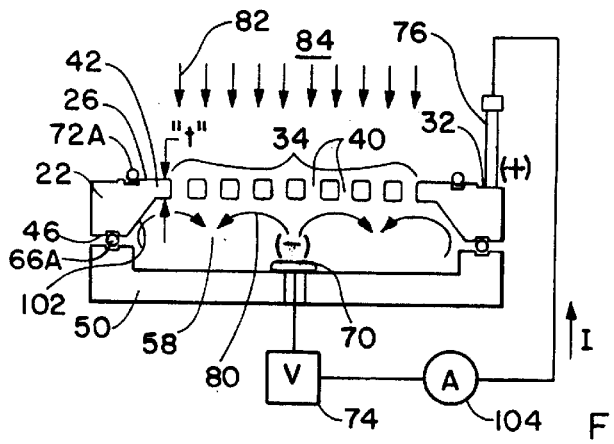
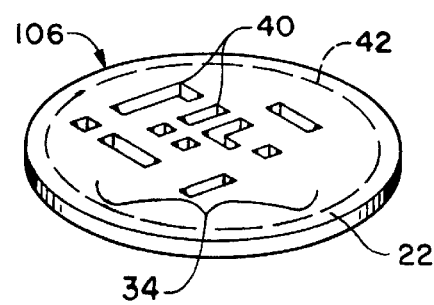
FIGURE 4A
FIGURE 4B
FIGURE 4C
FIGURE 5

APPARATUS AND SYSTEM FOR FABRICATING LITHOGRAPHIC STENCIL MASKS

CROSS REFERENCE TO RELATED APPLICATIONS

This application is a division of application Ser. No. 08/961,350, filed on Oct. 30, 1997 now U.S. Pat. No. 5,968,336.

FIELD OF THE INVENTION

This invention relates generally to lithography and specifically to an improved method, apparatus and system for fabricating stencil masks for ion beam and electron beam lithographic systems.

BACKGROUND OF THE INVENTION

Ion and electron beam lithographic systems utilize a stencil mask to pattern a resist coated target. These stencil masks can include a thin membrane which carries the mask pattern. Typically, the stencil mask includes a substrate, and the membrane is an area of reduced thickness on the substrate. The mask pattern can be formed by solid areas and openings in the membrane. The membrane can also include an ion absorbing layer formed of a conductive material deposited on the solid areas of the membrane. The conductivity of the ion absorbing layer can be used to provide a ground path to prevent charge build up on the membrane. In addition, the ion absorbing layer preferably has a high emissivity to facilitate radiative heat removal due to absorption of incident ions.

FIG. 1 schematically illustrates a prior art stencil mask 10. The stencil mask 10 includes a substrate 12 which has been etched to form a membrane 14. A mask pattern 16 has been formed on the membrane 14 by etching a desired pattern of openings 18 through the membrane 14. In addition, an ion absorbing layer 20 has been formed on one side of the membrane 14 on solid areas of the mask pattern 16. Typically, the substrate 12 and membrane 14 comprise silicon. Other deposited or grown materials, such as SiC, SiN, and BN, can also be used to form portions of the substrate 12 and membrane 14. A representative thickness for the membrane 14 is from 2–10$\mu$m.

One prior art process for forming a thin membrane is described in U.S. Pat. No. 5,110,373 entitled "Silicon Membrane With Controlled Stress". This process includes electrochemically etching a backside of a substrate with a required membrane pattern. A thickness of the membrane is controlled by initially doping the substrate to a required depth with dopants of a predetermined concentration. One aspect of prior art membrane formation processes is that the membrane can be difficult to uniformly etch with the required dimensional accuracy.

In addition, any layers of material added to portions of the membrane, such as the ion absorbing layer, can produce stresses and distortion in the membrane. For example, resist masks and hard masks, required for forming the ion absorbing layer, can stress the membrane. These stresses can distort the mask pattern, and contribute to membrane rupture. Some membrane fabrication processes may also require dry etching and handling of the thin membrane, which can lead to stress-induced distortion, as well as breakage of the membrane.

In view of the foregoing, improved methods are needed for fabricating stencil masks for electron beam and ion beam lithography. The present invention is directed to an improved method for fabricating stencil masks. The method is characterized by reduced complexity and an improved stencil mask.

SUMMARY OF THE INVENTION

In accordance with the present invention, a method, apparatus and system for fabricating stencil masks for electron beam and ion beam lithography are provided. The method, simply stated, comprises: providing a substrate; defining a membrane area by implanting a dopant into a first side of a substrate; defining a mask pattern by etching recesses in the membrane area; and then forming a membrane by etching from a second side of the substrate. With this method, the membrane area and mask pattern can be defined on a front side of a standard full thickness silicon wafer, using conventional semiconductor fabrication equipment. Once the membrane area and mask pattern have been defined, the back side of the substrate can be etched to form the membrane and complete the mask pattern.

In an illustrative embodiment, a P– silicon substrate is provided. Initially, an N+ membrane area is defined on the substrate by ion implanting an n-type dopant into the substrate to a selected depth. A TEOS hard mask is then formed on the substrate, and the N+ membrane area is RIE etched with a pattern of recesses to define the mask pattern. Following formation of the recesses, the P– substrate is back side etched to the selected depth using a solution of KOH/water, or alternately TMAH/water. During the wet etch, the N+ membrane area can be electrically biased to provide an etch selectivity in which only the P– substrate is attacked by the wet etchant.

The apparatus is adapted to electrochemically etch the back side of the substrate to form the membrane and open the mask pattern. The apparatus includes an etch chamber adapted to isolate and apply a wet etchant to the back side of the substrate. In addition, the apparatus includes a pressure equalization chamber adapted to apply an inert liquid, such as DI water (de-ionized water), to the front side of the substrate. The pressure equalization chamber equalizes pressure on either side of the substrate, so that a rupture during formation of the membrane is less likely to occur. The apparatus also includes an electrode adapted to apply a voltage potential to the membrane area to insure etch selectivity. Still further, the apparatus includes a surge chamber and a flexible membrane, adapted to transfer pressure pulses generated by the etchant source to the pressure equalization chamber.

The system includes the apparatus and conventional semiconductor fabrication equipment configured to define the membrane area and mask pattern. The semiconductor fabrication equipment can include: an ion implanter for implanting dopants in the substrate to define the membrane area; optical or e-beam pattern generators for defining the mask pattern; a chemical vapor deposition apparatus for growing a TEOS hard mask for the mask pattern; and a reactive ion etcher for etching recesses in the substrate to form the mask pattern.

BRIEF DESCRIPTION OF THE DRAWINGS

FIG. 1 is a schematic perspective view of a prior art stencil mask;

FIG. 2 is a block diagram illustrating broad steps in a method for fabricating a stencil mask in accordance with the invention;

FIGS. 3A–3K are schematic cross sectional views illustrating steps in the method of the invention;

FIG. 4A is an exploded perspective view of an apparatus for fabricating stencil masks in accordance with the invention;

FIG. 4B is a schematic cross sectional view of the apparatus and a stencil mask illustrating etching of a membrane for the stencil mask;

FIG. 4C is a schematic perspective view of the completed stencil mask; and

FIG. 5 is a block diagram of a system for performing the method of the invention.

DETAILED DESCRIPTION OF THE PREFERRED EMBODIMENTS METHOD

Referring to FIG. 2, a method for fabricating a stencil mask includes the broad steps of:

A. Providing a silicon substrate.

B. Defining a membrane area on a first side of the substrate by implanting a dopant to a selected depth.

C. Defining a mask pattern by patterning and etching recesses in the membrane area.

D. Electrochemically etching the substrate from a second opposing side of the substrate to form the membrane, open the recesses, and complete the mask pattern.

Referring to FIGS. 3A–3K, steps A–C of the above outlined method are illustrated. Step D will be subsequently described with reference to FIGS. 4A and 4B.

Initially, as shown in FIG. 3A a silicon substrate 22 can be provided. The silicon substrate 22 can be a standard wafer used in semiconductor fabrication processes. In the illustrative embodiment, the wafer comprises P– single crystal silicon having <100> Miller indices, and a resistance of 17.5 (+/−2.5) ohms-cm. A diameter and thickness of the wafer can be selected as required. A representative diameter of the wafer can be 200 mm and a representative thickness can be 650 $\mu$m.

Prior to processing, the substrate 22 can be cleaned using a suitable process such as an RCA clean. Additionally, a screen oxide layer (not shown) can be formed on the cleaned substrate 22. The purpose of the screen oxide layer is to reduce channeling during a subsequent implant step. The screen oxide layer can be a layer of silicon dioxide ($SiO_2$) thermally grown to a thickness of about 200Å.

Next, as shown in FIG. 3B, an N+ implant can be performed. The N+ implant can be performed using ion implantation of an n-type dopant such as P– or As– into a front side 26 (face) of the substrate 22. A dopant activation-drive step can then be performed to activate and drive the dopant into the substrate 22 to a selected depth "d". This step can be performed by heating the substrate 22 to a temperature between about 900° C. to 1200° C. An N+/P–junction 23 located approximately at the depth "d", will define the thickness "t" (FIG. 4B) of the subsequently formed membrane 42 (FIG. 4B). A representative value for the depth "d" can be from 2 $\mu$m to 10 $\mu$m.

Next, as shown in FIG. 3C, a TEOS (tetra-ethyl-orthosilicate) layer 24 can be blanket deposited on the substrate 22. A LPCVD process can be used to deposit the TEOS layer 24 on all exposed surfaces including the front side 26, side and backside of the substrate 22. In general, a LPCVD deposition process will produce a relatively dense TEOS layer 24 with a low carbon content. These characteristics will facilitate subsequent metallization processes. A temperature of the LPCVD deposition process can be approximately 800° C. A thickness of the TEOS layer 24 can be from 500Å to 5000Å.

Next, as shown in FIG. 3D, a resist mask 28 can be formed on the TEOS layer 24 proximate to the front side 26 of the substrate 22. The resist mask 28 is preferably an optical photoresist with a wide topside EBR (edge beam removal) area that exposes from 0.5 to 0.75 inches of the topside edge of the substrate 22 (exposing the TEOS layer 24). In addition, a hardening or "bake" step can be performed by heating the resist mask 28 to a selected temperature for a selected time period. Using the resist mask 28 to protect portions of the front side 26 of the substrate 22, a wet chemical etch can be performed to remove unwanted portions of the TEOS layer 24. One suitable wet etchant is a mixture of ammonium fluoride ($NH_4F$) and HF (hydrofluoric acid) in a 7:1 ratio, commonly referred to as 7:1 BOE (buffered oxide etchant).

Next, as shown in FIG. 3E, the resist mask 28 (FIG. 3D) can be stripped. Depending on the type of resist used, the stripping step can also be performed using a wet chemical stripper. One suitable wet chemical stripper for photoresist is known as "Piranha" a mixture of sulfuric acid and hydrogen peroxide.

Next, as shown in FIG. 3F, a metal layer 30 can be deposited on the TEOS layer 24 and on exposed portions of the front side 26 of the substrate 22. The metal layer 30 will be used to form metal silicide contacts 32 on the substrate 22 for a subsequent electrochemical etch process. Suitable metals for the metal layer 30 include the refractory metals, such as titanium (Ti), tungsten (W), tantalum (Ta), platinum (Pt), and molybdenum (Mo). In general, suicides of these metals ($WSi_2$, $TaSi_2$, $MoSi_2$, $PtSi_2$, and $TiSi_2$) can be formed by alloying with a silicon surface. Following deposition of the metal layer 30, a sintering process can be performed in which the substrate 22 and metal layer 30 are heated to a temperature of about 650° C. to 820° C. At these temperatures, the metal layer 30 reacts with the silicon substrate 22 to form the metal silicide contacts 32. This type of sintering process is also known in the art as salicide sintering.

Next, as shown in FIG. 3G, the unreacted portions of the metal layer 30 can be removed. This can be done using an etch process with a suitable etchant. With the metal layer 30 formed of titanium, a suitable etchant comprises a mixture of hydrogen peroxide ($H_2O_2$) and sulfuric acid ($H_2SO_4$)

Next, as shown in FIG. 3H, a second TEOS layer 24A can be deposited on the metal silicide contacts 32 and over the originally deposited TEOS layer 24. The two TEOS layers 24 and 24A will be used to form a hard mask 38 (FIG. 3J) for defining a mask pattern 34 (FIG. 3K) on the front side 26 of the substrate 22. The second TEOS layer 24A can be deposited to a desired thickness using a plasma enhanced chemical vapor deposition (PECVD) process performed at a temperature of about 400° C.

Next, as shown in FIG. 3I, a resist mask 36 can be formed on the second TEOS layer 24A. The resist mask 36 can be an optical or e-beam resist patterned using an optical or e-beam pattern generator. The resist mask 36 is patterned with openings that correspond to the subsequently formed mask pattern 34 (FIG. 3K). In addition, a hardening or "bake" step of the resist mask 36 can be performed by heating the resist to a selected temperature for a selected time period.

Next, as shown in FIG. 3J, the TEOS layers 24 and 24A can be etched to form a bi-layer hard mask 38 for etching the substrate 22 to define the mask pattern 34 (FIG. 3K). A suitable process for etching the TEOS layers 24 and 24A to form the hard mask 38 comprises reactive ion etching with a fluorine based etching species. Following formation of the hard mask 38, the resist mask 36 (FIG. 3I) can be stripped as previously explained (e.g., Piranha). Alternately the resist mask 36 can be left in place during etching of the substrate 22 to define the mask pattern 34 (FIG. 3K).

With the hard mask 38 formed, the front side 26 of the substrate 22 can be etched with recesses 40 to define the mask pattern 34 (FIG. 3K). Etching of the substrate 22 can be with a reactive ion etch process using a suitable etching species such as HBr, $Cl_2$ or $CCl_4$. This etch process can also be performed with magnetically enhanced reactive ion etching (MERIE). The etch process is controlled so that the recesses 40 are formed in the substrate to a selected depth that is at least equal to, or greater than, the depth "d" (FIG. 3B) of the N+ implant. For example, the recesses 40 can extend through the N+ layer (FIG. 3B) and stop approximately at the N+/P−junction 23.

Next, as shown in FIG. 3K, the TEOS hard mask 38 can be stripped. This can be performed using an HF dip as previously explained. The recesses 40 in the front side 26 of the substrate 22 define the mask pattern 34. With the mask pattern 34 defined, the membrane 42 (FIG. 4B) can be formed by etching from a back side 46 (second side) of the substrate 22. As will be further explained, the membrane etch step can be controlled to end point at the N+/P−junction 23. In addition, the membrane etch step will open the pattern of recesses 40 so that the mask pattern 34 is completed.

APPARATUS

Referring to FIGS. 4A and 4B, an apparatus 48 for electrochemically etching the backside 46 of the substrate 22 to form the membrane 42 (FIG. 4B) and complete the mask pattern 34 (FIG. 4B) is shown. As shown in FIG. 4A, the apparatus 48 includes a base plate 50, a cover plate 52 and an inert liquid manifold 54. The base plate 50, cover plate 52 and manifold 54 are configured for mating assembly to retain the substrate 22 and form a sealed etch chamber 58 for etching the back side 46 of the substrate 22. Threaded fasteners 56 and mating threaded openings 60 in the base plate 50 can be used for securing the assembly.

The base plate 50 includes internal passageways (not shown) in flow communication with multiple etchant supply conduits 62A and etchant discharge conduits 62B. The etchant supply conduits 62A are in flow communication with an etchant pump 78. The internal passageways in the base plate 50 provide a flow path from the etchant supply conduits 62A to the etch chamber 58. During an etch process using the apparatus 48, the etchant pump 78 continuously pumps a wet etchant 80 (FIG. 4B) through the etch chamber 58 to etch the backside 46 of the substrate 22 to form the membrane 42. Reactive by-products can be discharged with the reacted wet etchant 80 through the discharge conduits 62B.

The base plate 50 also includes a through opening 68 wherein an etchant electrode 70 can be mounted. The etchant electrode 70 is electrically connectable to a voltage source 74 (FIG. 4B). During an electrochemical etch process using the apparatus 48, the etchant electrode 70 can be used to electrically bias the etchant 80 circulating in the etch chamber 58. For example, the etchant electrode 70 can be maintained at a negative polarity (−).

Still referring to FIG. 4A, multiple substrate electrodes 76 are mounted to openings in the cover plate 52 and inert liquid manifold 54. The substrate electrodes 76 can be spring loaded members in electrical communication with electrical connectors 77. The electrical connectors 77 are in electrical communication with the voltage source 74 (FIG. 4B). In the assembled apparatus 48, the substrate electrodes 76 electrically contact the metal silicide contacts 32 on the substrate 22. This permits the N+ area (FIG. 3B) of the substrate 22 to be electrically biased with a positive polarity (+). The electrical biasing increases etch selectivity by preventing the N+ area from being attacked by the negatively biased wet etchant 80. On the other hand, the P− area (FIG. 3B) of the substrate 22 will be attacked by the negatively biased wet etchant 80.

The base plate 50 also includes circular grooves 64A–C configured to retain mating circular seal rings 66A–C. With the apparatus 48 assembled, the seal rings 66A–C are adapted to contact the back side 46 of the substrate 22. The seal rings 66A–C seal the etch chamber 58 while allowing the wet etchant 80 (FIG. 4B) to contact a membrane area 44 on the back side 46 of the substrate 22. The inner seal ring 66A defines the diameter of the membrane area 44 on the back side 46 of the substrate 22.

The apparatus 48 also includes a set of seal rings 72A–B that mount to mating grooves 85A–B in the inert liquid manifold 54. In the assembled apparatus 48, the seal rings 72A–B contact the front side 26 of the substrate 22. The seal rings 72A–B, inert liquid manifold 54 and a flexible membrane 88 form a pressure transfer chamber 84 wherein an inert liquid 82 (FIG. 4B) can be contained. Preferably, the inert liquid 82 is in a stagnant or non-circulating configuration. The inert liquid 82 contacts the front side 26 of the substrate 22 and equalizes the pressure exerted by the wet etchant 80 on the back side 46 of the substrate 22. This pressure equalization helps to prevent rupture of the membrane 42 during the wet etch process during formation of the membrane 42.

One suitable inert liquid 82 (FIG. 4B) comprises deionized (DI) water. The inert liquid 82 can be injected into the pressure transfer chamber 84 (FIG. 4A) through a first valve V1 (FIG. 4A) and through an inert liquid conduit 86A (FIG. 4A) in flow communication the first valve V1. In addition, the inert liquid conduit 86A (FIG. 4A) is in flow communication with internal passageways (not shown) and with the pressure transfer chamber 84. An inert liquid exhaust conduit 86B (FIG. 4A) allows the inert liquid 82 to discharge from the pressure transfer chamber 84 through a second valve V2 (FIG. 4A).

As also shown in FIG. 4A, an inert liquid side 91 of the flexible membrane 88 contacts the inert liquid 82 being circulated in the pressure transfer chamber 84. At the same time an opposing etchant side 89 of the flexible membrane 88 contacts the wet etchant circulating in a surge chamber 92 formed in the cover plate 52. The surge chamber 92 is in flow communication, via internal passageways, with an etchant supply conduit 90A and an etchant exhaust conduit 90B. A first set of seal rings 94A–B and mating grooves 96A–B in the inert liquid manifold 54 seal the flexible membrane 88 on the inert liquid side 91. A second set of seal rings 98A–B and mating grooves 100A–B in the cover plate 52 seal the flexible membrane 88 on the wet etchant side 89.

The purpose of the flexible membrane 88 is to transfer pressure pulses generated by surges of the etchant pump 78 to the pressure transfer chamber 84. These pressure pulses are then transferred by the flexible membrane 88 to the inert liquid 82 in the pressure transfer chamber 84. The pressure pulses generated by the etchant pump 78 will cause corresponding pressure pulses in the etch chamber 58. Pressure pulses are thus equalized on opposing sides of the membrane 42. Pressure pulse equalization helps to reduce the possibility of membrane rupture during the etch process.

During an etch process using the assembled apparatus 48, the membrane area 44 on the backside 46 of the substrate 22 can be etched with a recess 102 (FIG. 4B) to form the membrane 42. One suitable wet etchant 80 for etching the silicon substrate 22, with the recess 102, to form the membrane 42, comprises a solution of KOH (potassium hydroxide) and water (e.g., 40% by weight KOH in $H_2$). Another suitable etchant for etching the silicon substrate 22 comprises TMAH (tetramethyl ammonium hydroxide) and water (e.g., 25% by weight TMAH in water).

With the etch process performed using a solution of KOH and water, the recess 102 (FIG. 4B) includes sloped sidewalls. The etch process can be end pointed at the previously defined N+/P−junction 23 (FIG. 3B) by the electrochemical formation of anodic oxide on the N+ layer. End pointing the recess 102 at the N+/P−junction 23 forms the membrane 42 (FIG. 4B) with a required thickness "t". Also by end pointing the recess 102 at the N+/P−junction 23 (FIG. 3B), the individual recesses 40 of the mask pattern 34 become through openings in the completed membrane 42.

Endpoint detection during the wet etch process can be performed by monitoring chemical characteristics of the etchant 80 (FIG. 4B). Endpoint detection can also be performed by monitoring the current (I) through the electrochemical cell created by the etchant electrode 70 and the substrate electrodes 76. This can be accomplished with an ammeter 104 (FIG. 4B).

Once the recesses 40 have opened, the etch process can be terminated to prevent etching of the front side 26 of the substrate 22 by the etchant 80. As shown in FIG. 4C, the completed stencil 106 includes the substrate 22, the membrane 42 (FIG. 4B) having a thickness of "t", and the mask pattern 34 formed by the recesses 40 through the membrane 42.

OPERATION OF APPARATUS

Initially the substrate 22 (FIG. 4A) can be inserted between the inert liquid manifold 54 (FIG. 4A) and the base plate 50 (FIG. 4A). A front side 26 of the substrate 22 faces the pressure transfer chamber 84 (FIG. 4B) wherein the inert liquid 82 (FIG. 4B) is contained. A back side of the substrate 22 faces the etch chamber 58 (FIG. 4B) wherein the wet etchant 80 (FIG. 4B) is contained. With the substrate 22 in place, the threaded fasteners 56 (FIG. 4A) can be used to assemble the cover plate 52, the inert liquid manifold 54 and the base plate 50 to one another.

Next, the electrical connections of the electrodes 76 (FIG. 4A) with the contacts 32 (FIG. 3K) on the front side 26 of the substrate 22 can be confirmed.

Next, valves V1 (FIG. 4A) and V2 (FIG. 4A) can be opened to supply DI water to the pressure transfer chamber 84 (FIG. 4A). Once the DI water begins flowing through valve V2, valve V1 can be closed to terminate the DI supply. Valve V2 can also be closed. At this point the pressure transfer chamber 84 is filled with DI water.

Next, flow of the wet etchant 80 (FIG. 4B) to the etch chamber 58 (FIG. 4A) and to the surge chamber 92 (FIG. 4A) can be initiated. The flow of the wet etchant 80 is from pump 78 through etchant supply conduits 62A (FIG. 4A) and 90A (FIG. 4A). In addition, the wet etchant 80 can be recirculated through etchant discharge conduits 62B (FIG. 4A) and 90B (FIG. 4A) back to the pump 78.

Next, a voltage V can be applied to the electrodes 76 (FIG. 4A) in contact with the electrodes 32 (FIG. 3K) for the N+ layer (FIG. 3B) and to the etchant 80 (FIG. 4B) in contact with the backside of the substrate 22. Etching can continue to form the membrane 42 (FIG. 4B).

Next, the etch chamber 58 (FIG. 4A), surge chamber 92 (FIG. 4A) and pressure transfer chamber 84 (FIG. 4A) can be drained at the same time in order to maintain equal pressure on each side of the membrane 42 (FIG. 4B).

SYSTEM

Referring to FIG. 5, a system 108 for performing the method of the invention is illustrated. The system 108 includes a screen oxide apparatus 110 for growing an oxide layer (not shown) on the substrate 22. A suitable screen oxide apparatus 110 is manufactured by ASM-Europe of Bilthoven, The Netherlands, and is designated "ADVANCE 400/2". Prior to oxide growth, the substrate 22 can be cleaned using an RCA clean with a cleaning apparatus 109. One suitable wet cleaning apparatus is available from Steag Micro Tech of Donaueschingen, Germany.

The system 108 also includes an ion implant apparatus 112 adapted to implant dopants to form the N+ area (FIG. 3B) and the N+/P−junction 23 (FIG. 3B). A suitable ion implant apparatus is manufactured by Eaton Corporation, Beverly, Mass. and is designated "NV-8250 MEDIUM CURRENT IMPLANTER". An annealing furnace for activating the dopants can also be associated with the ion implant apparatus 112.

The system 108 also includes an LPCVD furnace 114 for depositing TEOS layer 24 (FIG. 3C) . A suitable LPCVD furnace 114 is available from ASM-Europe of Bilthoven, The Netherlands, and is designated "ADVANCE 400/2".

The system 108 also includes a physical vapor deposition (PVD) apparatus 116 for depositing the metal layer 30 (FIG. 3F). A suitable physical vapor deposition apparatus is manufactured by Applied Materials of Santa Clara, Calif. and is designated "APPLIED MATERIALS ENDURA METAL DEP MACHINE".

The system 108 also includes a plasma enhanced chemical vapor deposition apparatus 118 for depositing the TEOS layers 24A (FIG. 3H). A suitable plasma enhanced chemical vapor deposition apparatus is manufactured by Applied Materials of Santa Clara, Calif. and is designated "APPLIED 5000 PECVD".

The system 108 also includes an optical or e-beam pattern generator 120 for patterning the resist mask 36 (FIG. 3I). A suitable optical pattern generator is an "ALTA 3000" manufactured by Etec Systems Inc., Hayward, Calif. A suitable e-beam pattern generator is manufactured by Leica Lithography Systems, Ltd., Cambridge, United Kingdom and is designated "LEICA VB6-HR".

The system 108 also includes a reactive ion etcher 122 for etching recesses 40 (FIG. 3J) in the substrate 22 to form the mask pattern 34. A reactive ion etcher is manufactured by Applied Materials of Santa Clara, Calif. and is designated "APPLIED 5000 ETCHER".

The system 108 also includes the apparatus 48 (FIG. 4A) for etching the back side 46 of the substrate 22 to form the membrane 42 (FIG. 4B). Transport of the substrate 22 within the system 108 can be accomplished with wafer carriers and automated loading and unloading apparatus associated with the individual components. In addition, for simplicity only the major components required for fabricating the stencil mask have been described. However, as would be apparent to those skilled in the art, additional components and alternate components, could also be included within the system 108 to fabricate a stencil mask in accordance with the method of the invention.

Thus the invention provides an improved method, apparatus, and system for fabricating a stencil mask for ion beam and electron beam lithography. The method includes defining a membrane area and forming the mask pattern on a silicon substrate using semiconductor circuit fabrication processes. Following formation of the mask pattern, the membrane for the stencil mask can be formed by back side etching the silicon substrate. The apparatus is adapted to perform the back side etching while pressure is equalized on opposing sides of the substrate. In addition, pressure surges can be accommodated with a flexible membrane.

While the invention has been described with reference to certain preferred embodiments, as will be apparent to those skilled in the art, certain changes and modifications can be made without departing from the scope of the invention as defined by the following claims.

What is claimed is:

1. An apparatus for etching a stencil mask comprising:
   a first plate and a second plate configured to retain a mask substrate therebetween;
   an etch chamber formed in the first plate in flow communication with a supply of a wet etchant, said etch chamber configured to apply the wet etchant to a first side of the substrate; and
   a pressure equalization chamber in the second plate in flow communication with a supply of an inert liquid, said pressure equalization chamber configured to apply the inert liquid to a second side of the substrate.

2. The apparatus as claimed in claim 1 further comprising a flexible membrane having a first surface in contact with the inert liquid in the pressure equalization chamber, and a second surface in flow communication with the supply of the wet etchant.

3. The apparatus as claimed in claim 1 further comprising an electrode on the first plate or the second plate for contacting the substrate to apply a biasing voltage thereto.

4. The apparatus as claimed in claim 1 further comprising a third plate for mating engagement with the first plate and the second plate including a surge chamber and a flexible membrane in flow communication with the supply of the wet etchant.

5. An apparatus for etching a stencil mask comprising:
   a first plate including an etch chamber configured to apply a wet etchant from an etchant source to a first side of a mask substrate;
   a second plate configured for mating engagement with the first plate, said second plate including a pressure equalization chamber configured to apply an inert liquid to a second side of the substrate;
   a third plate configured for mating engagement with the second plate, said third plate including a surge chamber in flow communication with the etchant source; and
   a flexible membrane located between the second plate and the third plate, said membrane in fluid contact with the inert liquid in the pressure equalization chamber and with the wet etchant in the surge chamber, said membrane configured to transfer pressure surges from the etchant source to the inert liquid in the pressure equalization chamber.

6. The apparatus as claimed in claim 5 further comprising an electrode on the first plate, the second or the third plates, said electrode in electrical communication with a voltage source and configured to contact and electrically bias the substrate.

7. The apparatus as claimed in claim 5 further comprising a first seal ring on the first plate for contacting the first side of the substrate and a second seal ring on the second plate for contacting the second side of the substrate.

8. An apparatus for etching a stencil mask having a first side and a second side comprising:
   a first plate including an etch chamber in flow communication with a wet etchant;
   a second plate including a surge chamber in flow communication with the wet etchant;
   a third plate including a pressure equalization chamber in flow communication with an inert liquid;
   a membrane between the surge chamber and the pressure equalization chamber, said membrane configured to transfer pressure surges in the wet etchant to the inert liquid in the pressure equalization chamber;
   a first seal ring mounted to the first plate for sealing a membrane area on the first side when it is positioned for etching by the wet etchant within the etch chamber; and
   a second seal ring mounted to the third plate for sealing the second side when it is positioned for pressure application by the inert liquid within the pressure equalization chamber.

9. The apparatus as claimed in claim 8 further comprising an electrode mounted to the third plate configured to apply a biasing voltage to the second side.

10. The apparatus as claimed in claim 9 wherein the wet etchant comprises a solution comprising a compound selected from the group consisting of KOH and TMAH.

11. The apparatus as claimed in claim 9 further compriseing an electrode configured to apply a biasing voltage to the first side.

* * * * *